(12) United States Patent
Terayama et al.

(10) Patent No.: US 6,541,840 B1
(45) Date of Patent: Apr. 1, 2003

(54) ON-CHIP CAPACITOR

(75) Inventors: Fumihiko Terayama, Tokyo (JP); Seiiti Yamazaki, Tokyo (JP); Sintaro Mori, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/480,456

(22) Filed: Jan. 11, 2000

(30) Foreign Application Priority Data

Jul. 23, 1999 (JP) ............................................ 11-209200

(51) Int. Cl.$^7$ ................................................ H01L 29/00
(52) U.S. Cl. ........................ 257/516; 257/528; 257/532
(58) Field of Search ................................. 257/532, 371, 257/528, 516

(56) References Cited

U.S. PATENT DOCUMENTS 5,786,617 A * 7/1998 Merrill et al. .............. 257/371

* cited by examiner

Primary Examiner—Tom Thomas
Assistant Examiner—Thien F Tran
(74) Attorney, Agent, or Firm—Burns, Doane, Swecker & Mathis, LLP

(57) ABSTRACT

An on-chip capacitor is provided with a P-type silicon substrate, a bottom N-well region formed on said P-type silicon substrate, mutually adjacent first P-well and first N-well regions formed on said bottom N-well region, a first electrode formed on said first N-well region, and a second electrode formed on said first P-well region, a coupling surface is formed with said first N-well region and said first P-well region and a capacitance is formed between a power source voltage and a grounding voltage formed between said first P-well region and said bottom N-well region. Thus it is not necessary to maintain a device region, to form a capacitance, to form wiring or maintain a wiring region as in a conventional MOS capacitance while it is possible to obtain a required decoupling capacitance.

2 Claims, 8 Drawing Sheets

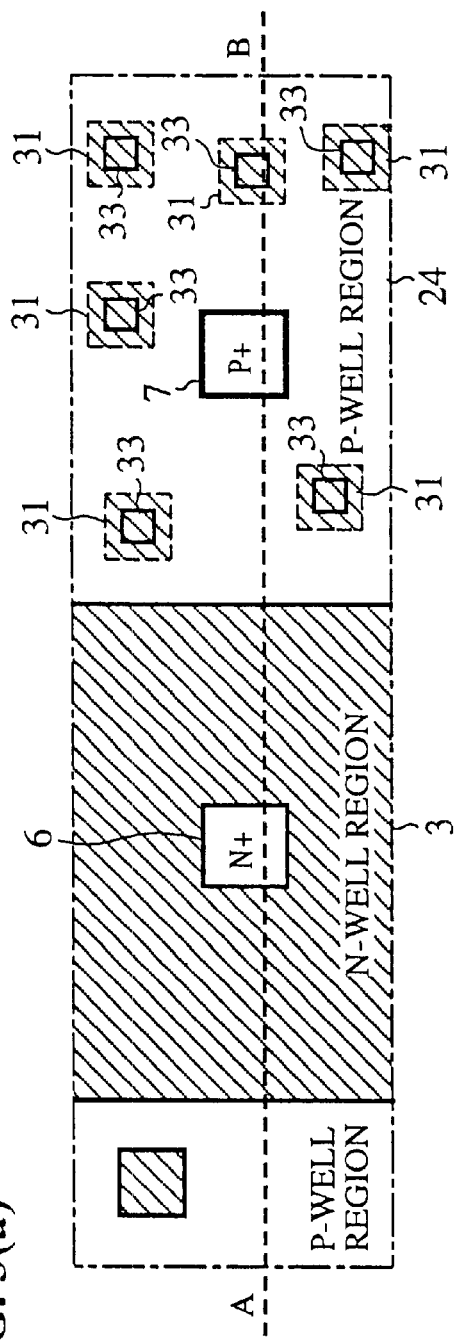
FIG. 3(a)
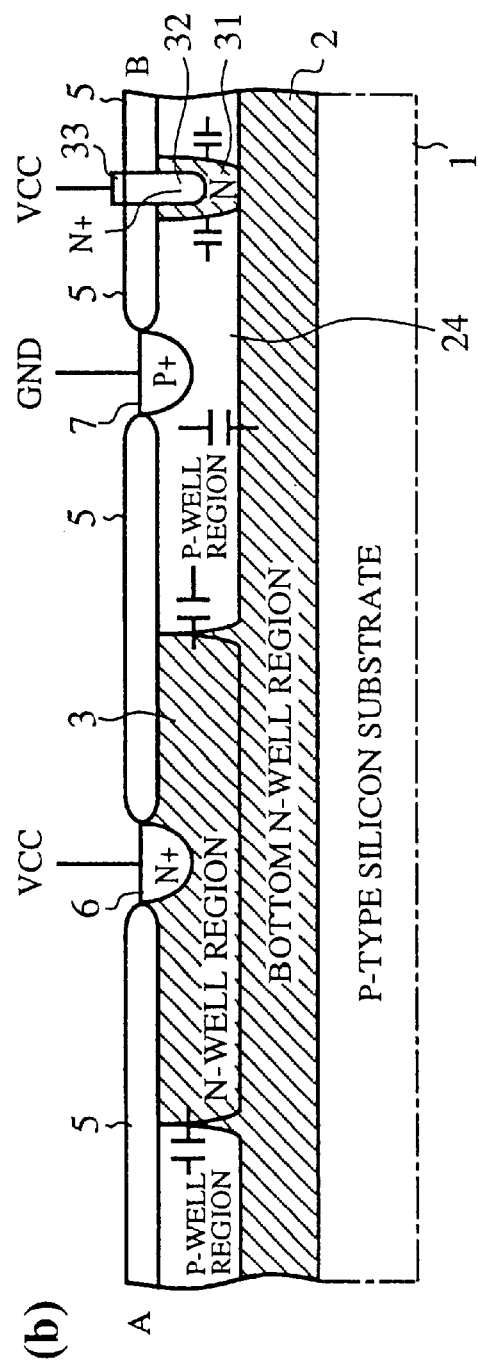
FIG. 3(b)
FIG. 3(c)

ON-CHIP CAPACITOR

FIELD OF THE INVENTION

The present invention relates to an on-chip capacitor which functions as a capacitance device formed in a semiconductor integrated circuit.

PRIOR ART

FIG. 6 shows the structure of an MOS capacitance of a conventional semiconductor integrated circuit. FIG. 6(a) is a plan view, (b) is a cross sectional view along the line A-B and (c) is an equivalent circuit. In the figures, reference numeral 61 denotes a P-type silicon substrate, 62 is an N-well region formed on the P-type silicon substrate 61, 63 is an N+ dispersion region forming a source and drain electrode, 64 is a gate electrode, 65 is an oxide film formed on the N-well region 62 and the P-type silicon substrate 61. FIG. 7 shows the structure of a poly-silicon capacitance of a conventional semiconductor integrated circuit. FIG. 7(a) is a plan view, (b) is a cross sectional view along the line A-B and (c) is an equivalent circuit. In the figures, reference numeral 71 denotes a P-type silicon substrate, 72 is an oxide film formed on the P-type silicon substrate 71, 73 is a lower poly-silicon gate, and 74 is an upper poly-silicon gate electrode.

FIG. 8 shows the structure of a CMOS device of a conventional semiconductor integrated circuit. FIG. 8(a) is a plan view, (b) is a cross sectional view along the line A-B and (c) is an equivalent circuit. In the figures, reference numeral 81 denotes a P-type silicon substrate, 82 is an N-well region formed on the P-type silicon substrate 81, 83 is a P-well region formed on the P-type silicon substrate 81 and connected to a grounding power source VSS (GND), 84 is a P+ dispersion region, 85 is an N+ dispersion region, 86 is an NMOS poly-silicon gate electrode, 87 is PMOS poly-silicon gate electrode and 88 is an oxide film.

The operation of the invention will be described below.

A conventional semiconductor integrated circuit uses a MOS capacitance having the structure shown in FIG. 6 and a poly-silicon capacitance having the structure shown in FIG. 7 as a capacitance device. When such capacitance devices are connected between a power source VCC and a grounding power source VSS (GND), the devices act as a decoupling capacitor with respect to the power source and GND noise.

A CMOS device which comprises the conventional semiconductor integrated circuit shown in FIG. 8 is provided with a PMOS in an N-well region 82 connected to the power source (VCC) and a NMOS in a P-well region 83 connected to the grounding power source (GND). A PN junction is formed between the N-well region 82 and the P-well region 83 and a capacitance component is formed by separating the N-well region 82 and the P-well region 83 electrically. A capacitance is formed between the power source (VCC) and the grounding power source (GND). Only the coupling surface between the N-well region 82 and the P-well region 83 contributes to the capacitance.

Since a decoupling capacitor in a conventional semiconductor integrated circuit is formed as above, it is possible for the capacitor to stabilize a power source voltage and to function as a decoupling capacitor with respect to noise from the power source and the grounding power source (GND). However in order to form these decoupling capacitors in the semiconductor integrated circuit, it is necessary to form a MOS capacitance or a silicon capacitance on the silicon substrate and to connect such a terminal to the power source (VCC) and the grounding power source (GND). In order to dispose the device, it is necessary to provide the required region and required wiring. Thus the problem has arisen that the effective disposable space to dispose the device in the semiconductor integrated circuit is reduced. Furthermore in the conventional CMOS device as shown in FIG. 8 the depth of the N-well region 82 and the P-well region 83 is only of the order of a few $\mu$m. Thus the problem has arisen that it is not possible to achieve a decoupling capacitance of a required capacitance in the semiconductor integrated circuit chip.

SUMMARY OF THE INVENTION

The present invention is proposed to solve the above problems and has the object of providing an on-chip capacitor capable of forming a capacitor device having a capacitance required between a power source voltage VCC and a grounding power source VSS (GND) and which does not require a device region or a wiring region on the semiconductor integrated circuit chip.

The on-chip capacitor of the present invention is provided with a P-type silicon substrate, a bottom N-well region formed on said P-type silicon substrate, mutually adjacent first P-well and first N-well regions formed on said bottom N-well region, a first electrode formed on said first N-well region, and a second electrode formed on said first P-well region. A coupling surface is formed with said first N-well region and said first P-well region and a capacitance between a power source voltage and a grounding voltage is formed between said first P-well region and said bottom N-well region.

The on-chip capacitor of the present invention forms a fixed number of second N-well regions without transistors or dispersion regions in said first P-well region.

The on-chip capacitor of the present invention is provided with a coupling region in said bottom well region instead of said second electrode so that said first P-well region and said P-type silicon substrate are connected.

The on-chip capacitor of the present invention is provided with an N-type silicon substrate, a bottom P-well region formed on said N-type silicon substrate, mutually adjacent first N-well and first P-well regions formed on said bottom P-well region, a first electrode formed on said first P-well region, and a second electrode formed on said first N-well region, a coupling surface is formed with said first N-well region and said first P-well region and a capacitance between a power source voltage and a grounding voltage capacitance is formed between said first P-well region and said bottom N-well region.

The on-chip capacitor of the present invention forms a fixed number of second P-well regions without transistors or dispersion regions in said first N-well region.

The on-chip capacitor of the present invention is provided with a coupling region in said bottom P-well region instead of said first electrode so that said first N-well region and said N-type silicon substrate are connected.

BRIEF DESCRIPTION OF THE DRAWINGS

FIG. 3 shows another structure of a on-chip capacitor of a semiconductor integrated circuit according to a second embodiment of the present invention as shown in FIG. 2. FIG. 3(a) is a plan view, (b) is a cross sectional view along the line A-B and (c) is an equivalent circuit.

DESCRIPTION OF THE PREFERRED EMBODIMENTS

The preferred embodiments of the present invention will be described below.

Embodiment 1

Figure 1A:
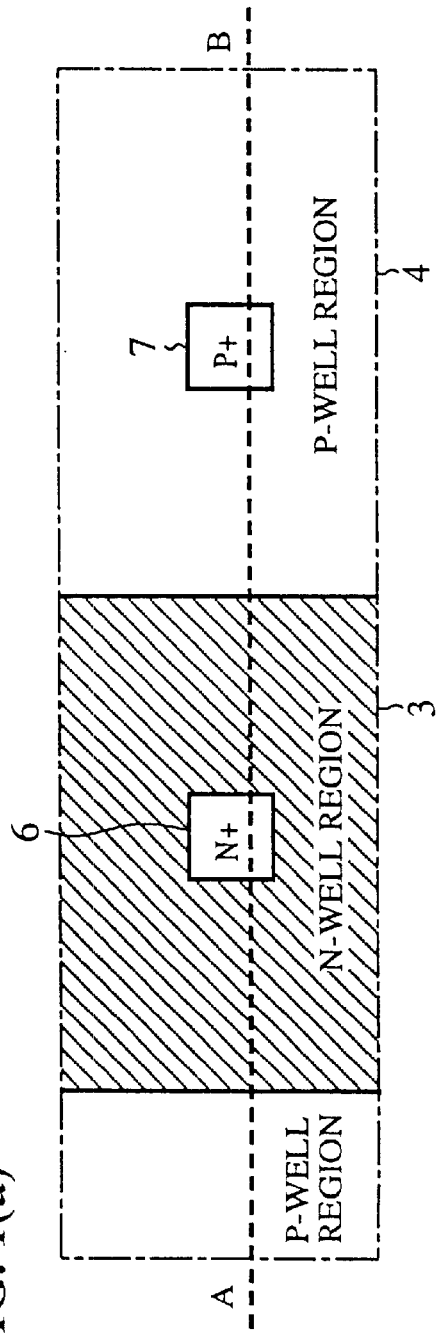
FIG. 1(a) is a plan view, (b) is a cross sectional view along the line A-B and (c) is an equivalent circuit.
Figure 1B:
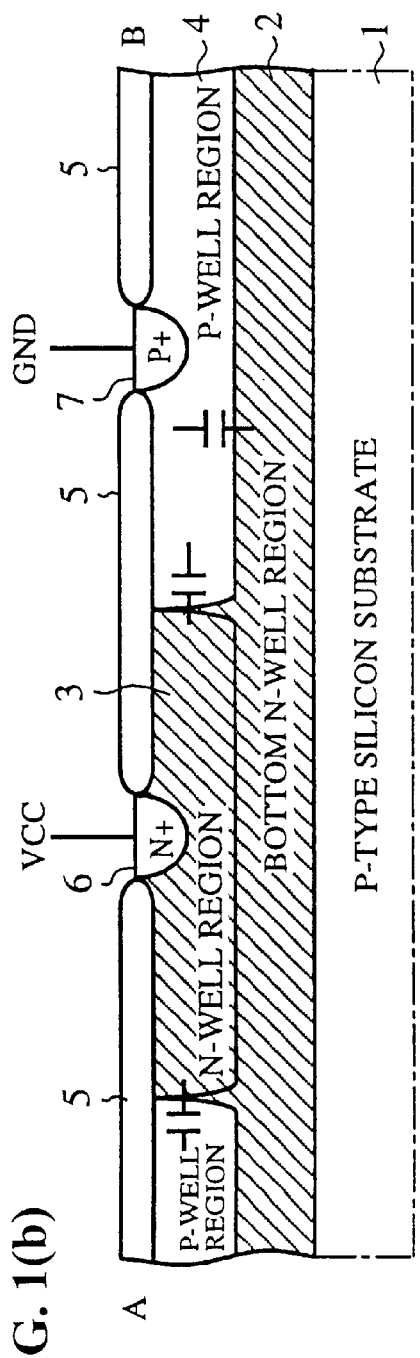
FIG. 1 shows the structure of a on-chip capacitor of a semiconductor integrated circuit according to a first embodiment of the present invention.
Figure 1C:
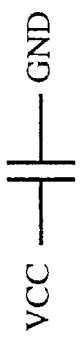

FIG. 1 shows the structure of an on-chip capacitor of a semiconductor integrated circuit according to a first embodiment of the present invention. FIG. (a) is a plan view, (b) is a cross sectional view along the line A-B and (c) is an equivalent circuit. In the figure, reference numeral 1 denotes a P-type silicon substrate, 2 is a bottom N-well region formed on said P-type silicon substrate 1, 3 is an N-well region (first N-well region) formed on said bottom N-well region 2, 4 is a P-well region (first P-well region) formed on said bottom N-well region 2, 5 is an oxide film formed on N-well region 3 and the P-well region 4, 6 is an N+ dispersion region to which a power source voltage VCC is applied (first electrode), 7 is a P+ dispersion region to which a grounding voltage VCC (GND) is applied (second electrode).

The operation of the invention will be described below.

Figure 8A:
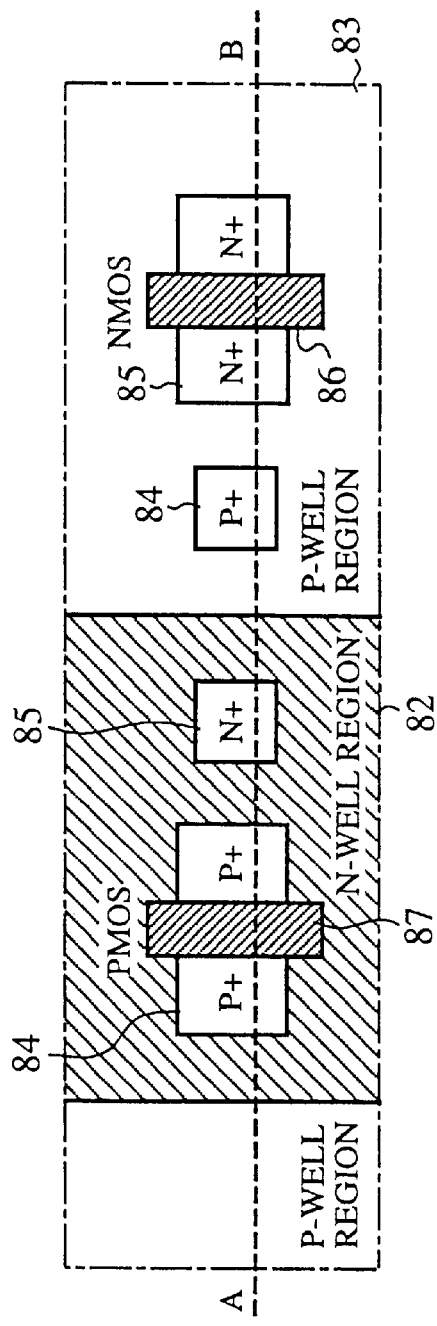
FIG. 8(a) is a plan view, (b) is a cross sectional view along the line A-B and (c) is an equivalent circuit.
Figure 8B:
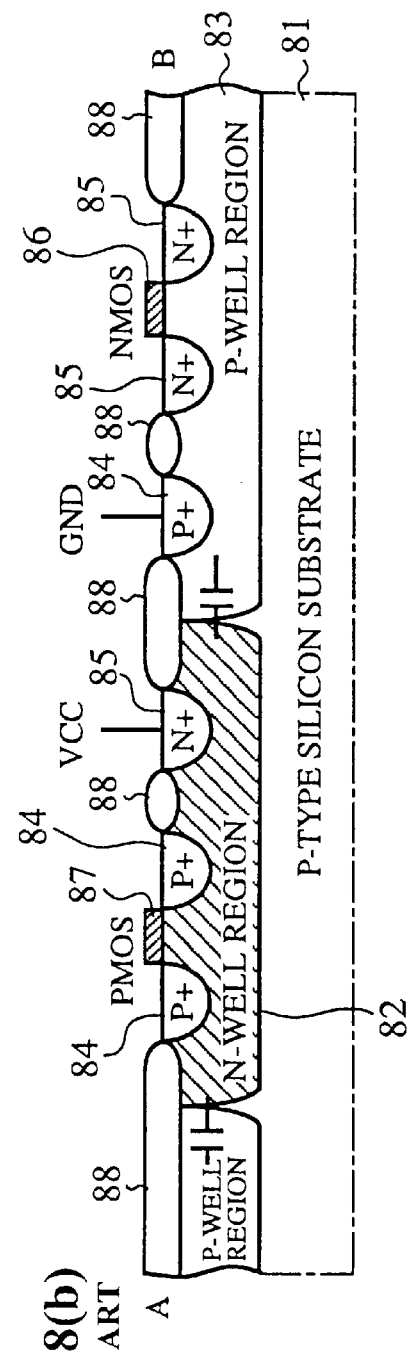
FIG. 8 shows the structure of a CMOS device of a conventional semiconductor integrated circuit.
Figure 8C:
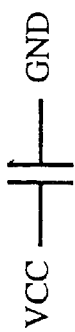

In the semiconductor integrated circuit shown in FIG. 1, a bottom N-well region 2 is formed comprised of an N-well region under an N-well region 3 and a P-well region 4. Since the bottom N-well region 2 is formed under the N-well region 3 and a P-well region 4, in a conventional semiconductor integrated circuit shown as shown in FIG. 8, in addition to a capacitance formed by the coupling surface between the N-well region 82 and the P-well region 83, a capacitance is formed on the boundary surface of the P-well region 4 and the N-well region 2.

In this way, it is possible to add a capacitance with respect to a surface area of the P-well region which contacts with the bottom N-well region 2 to the capacitance formed between the power source voltage VCC and the grounding power source VSS (GND).

As shown above, according to the first embodiment, since an N-well region 3 and a P-well region 4 are formed on the bottom N-well region 2, it is possible to form a coupling surface between the N-well region 3 and the P-well region 4 and to form a capacitance of a desired size between the bottom N-well region 2 and the P-well region 4. It is thus possible to obtain a decoupling capacitance of a required capacitance without the necessity to maintain a device region; form a capacitance, maintain a designated wiring region or form wiring as in the case of a conventional MOS capacitance.

In embodiment 1 above, a bottom N-well region 2 is formed on a P-type silicon substrate 1, and an N-well region 3 and a P-well region 4 are formed on the bottom N-well region 2. However by using the N-type silicon substrate as a silicon substrate, the same effect may be achieved even when a bottom P-well region is formed on the N-type silicon substrate or an N-well region or a P-well region are formed on the bottom P-well region.

Embodiment 2

Figure 2A:
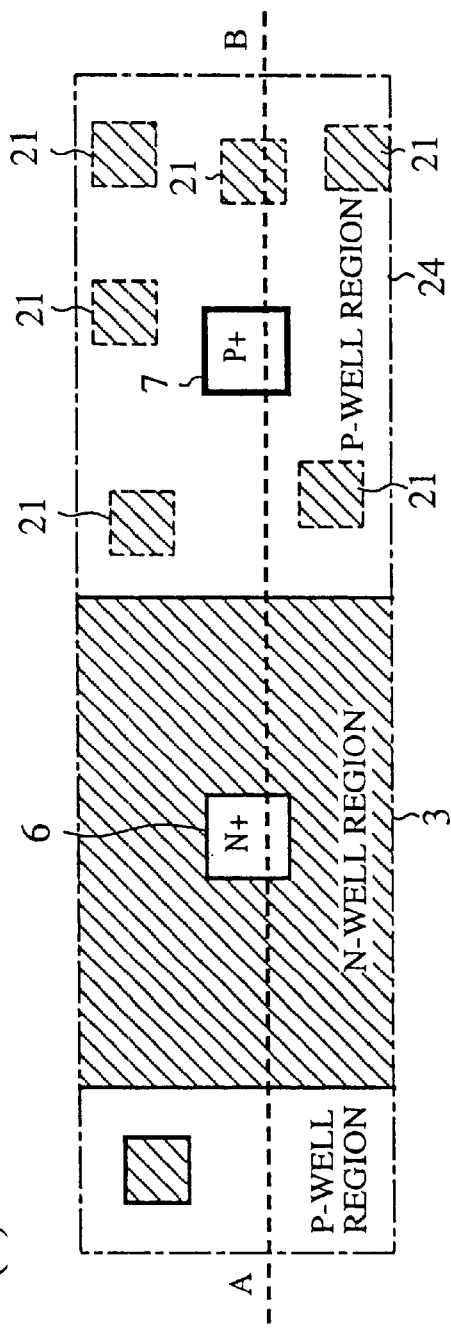
FIG. 2(a) is a plan view, (b) is a cross sectional view along the line A-B and (c) is an equivalent circuit.
Figure 2B:
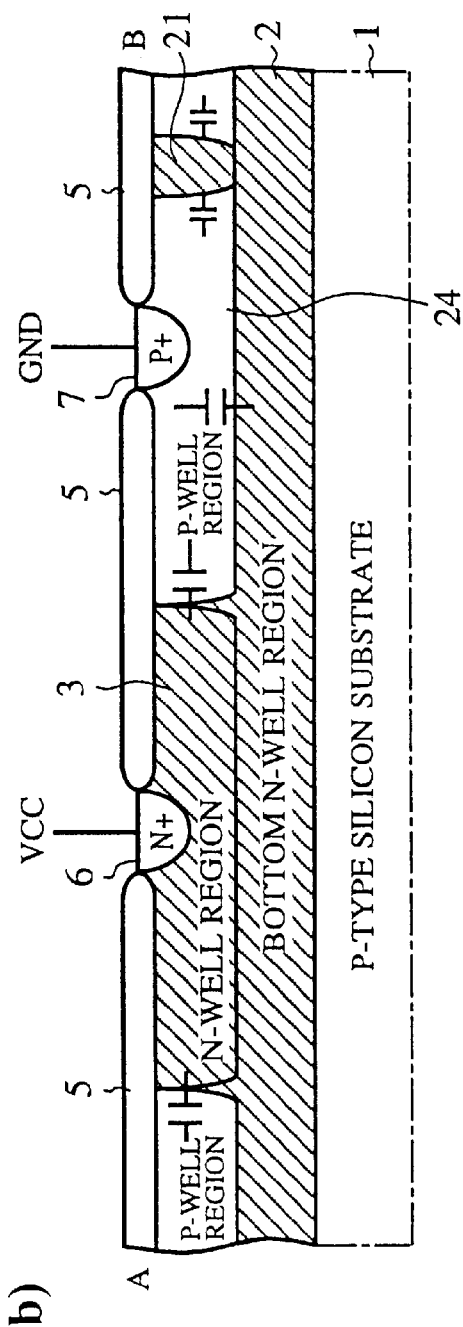
FIG. 2 shows the structure of a on-chip capacitor of a semiconductor integrated circuit according to a second embodiment of the present invention.
Figure 2C:
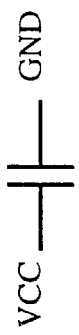

FIG. 2 shows the structure of a on-chip capacitor of a semiconductor integrated circuit according to a second embodiment of the present invention. FIG. 2(a) is a plan view, (b) is a cross sectional view along the line A-B and (c) is an equivalent circuit. In the figures, 24 is a P-well region (first P-well region) which is formed on the bottom N-well region 2 and 21 is a small N-well region (second N-well region) which is formed on the P-well region 24.

Other components are the same or similar to those described in Embodiment 1 above and are represented by the same reference numerals.

The operation of the invention is described below.

The on-chip capacitor for a semiconductor integrated circuit according to embodiment 2 as shown in FIG. 2 has the same structure as an on-chip capacitor for a semiconductor integrated circuit according to embodiment 1 as shown in FIG. 1 in that a bottom N-well region 2 is formed on the P-type silicon substrate land a small N-well region 21 is formed on a region in which a device is not formed in a P-well region 24 which is formed on the bottom N-well region 2.

As shown in FIG. 2(b), when a power source voltage VCC is applied to the N+ dispersion region 6 and a grounding voltage VSS (GND) is applied to the P+ dispersion region 7, the small N region 21 in which a device such as a transistor or a dispersion region is not formed is placed in electrical contact with a bottom N-well region 2. Thus its electric potential becomes VCC and a capacitance is formed between the lateral section of the small N region 1 and the P-well region 24 which is formed on the periphery of the small N region 1.

As shown above, a capacitance is formed by the formation of a plurality of small N-well regions 21 in the P-well region 24. The capacitance comprises a capacitance with the grounding voltage VSS (GND) is applied to the P+ dispersion region 7 and the power source voltage VCC applied to the N+ dispersion region, that is to say, a capacitance formed by a section which contacts with the N-well region 3 and the P-well region 24, a capacitance with respect to the bottom surface area of the P-well region 24, that is to say, a capacitance formed with the P-well region 24 and the bottom N-well region 2, and a capacitance obtained between the small N-well region 21 and the P-well region 24.

FIG. 3 shows another structure of an on-chip capacitor of a semiconductor integrated circuit according to a second embodiment of the present invention as shown in FIG. 2. FIG. 3(a) is a plan view, (b) is a cross sectional view along the line A-B and (c) is an equivalent circuit. In the figure, 31 is a small N-well region formed in the P-well region 24 (second N-well region), 32 is a N+ dispersion region formed in the small N-well region 31, 33 is a electrode which is connected to a power source voltage. The other components are the same as those as described in the second embodiment as shown in FIG. 2 and are represented by the same reference numerals.

The small N-well region 31 having the structure shown in FIG. 3 requires an electrode 33 connected to the wiring of the power source voltage VCC. To that degree, the region which forms the device is reduced, and in comparison with the conventional example shown in FIG. 6 to FIG. 8, it is possible to obtain a decoupling capacitance without forming a device.

As shown above, according to embodiment 2, an N-well region 3 and a P-well region 24 are formed on the bottom N-well region 2 and a plurality of small N-well regions 31 are formed in the P-well region 24. Thus it is possible to form a coupling surface between the N-well region 3 and the P-well region 24 and to form a capacitance of a desired size between the bottom N-well region 2 and the P-well region 24 and between the P-well region 24 and the plurality of small N-well regions 31. It is thus possible to obtain a decoupling capacitance of a required capacitance without the necessity to maintain a device region, form a capacitance, maintain a designated wiring region or form wiring as in the case of a conventional MOS capacitance.

In embodiment 2 above, a bottom N-well region 2 is formed on a P-type silicon substrate 1, and an N-well region 3 and a P-well region 24 are formed on the bottom N-well region 2. A small N-well region 31 is formed in the P-well region 24. However by using the N-type silicon substrate as a silicon substrate, the same effect may be achieved even when a bottom P-well region is formed on the N-type silicon substrate, an N-well region or a P-well region are formed on the bottom P-well region or when a P-well region is formed on the N-well region.

Embodiment 3

Figure 4A:
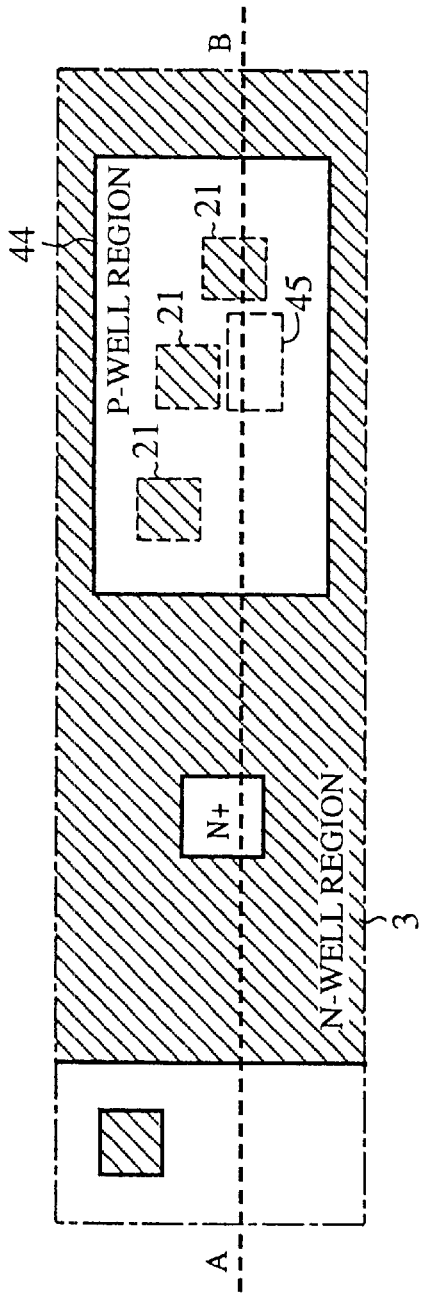
FIG. 4(a) is a plan view, (b) is a cross sectional view along the line A-B and (c) is an equivalent circuit.
Figure 4B:
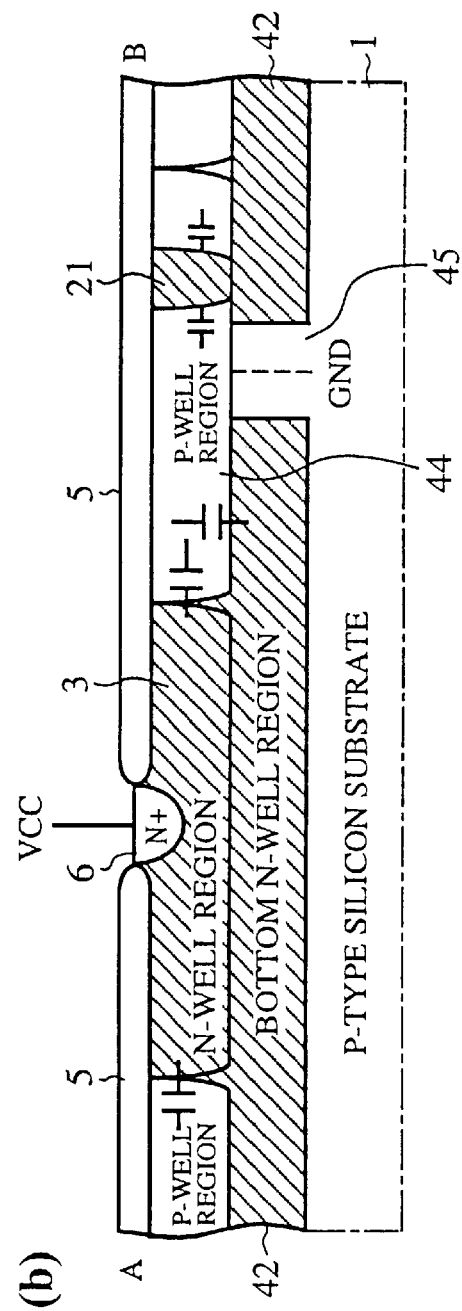
FIG. 4 shows the structure of a on-chip capacitor of a conventional semiconductor, integrated circuit according to a third embodiment of the present invention.
Figure 4C:
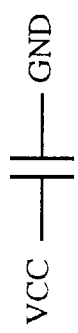

FIG. 4 shows the structure of a on-chip capacitor of a conventional semiconductor integrated circuit according to a third embodiment of the present invention. FIG. 4(a) is a plan view, (b) is a cross sectional view along the line A-B and (c) is an equivalent circuit. In the figures, 42 is a bottom N-well region, 44 is a P-well region formed on a bottom N-well region 42, 45 is a region formed through the bottom N-well region 42 of the P-type silicon substrate 1. The P-type silicon substrate 1 and the P-well region 44 are connected. The other components are the same as those shown in embodiment 2 in FIG. 2 and are represented by the same numerals.

The operation of the invention will be described below.

The on-chip capacitor for a semiconductor integrated circuit for embodiment 3 as shown in FIG. 4 has the same structure as an on-chip capacitor for semiconductor integrated circuit for embodiment 2 as shown in FIG. 2 in that a bottom N-well region 42 is formed on a P-type silicon substrate 1 and a small N region 21 is formed in a region in which a device for the P-well region 44 which is formed on the bottom N-well region 42 is not formed. Furthermore a coupling region 45 which connects the P-well region 44 and the P-type silicon substrate 1 is formed through a section of the bottom N-well region 42.

In the structure of the device in embodiment 3 as shown in FIG. 4, a P+ dispersion region (the region shown by reference numeral 7 in FIG. 2) which secures the electrical potential of the P-well region 44 to the grounding voltage GND is not provided. In its place, the potential of the P-well region 44 is fixed to the grounding voltage VSS (GND) through a coupling region 45.

Thus with the structure as shown in FIG. 4, there is no necessity to provide a terminal for applying the grounding voltage VSS (GND) to the upper section of the P-well region 44. It is possible to obtain the capacitance with respect to the bottom surface area of the P-well region 44 and the capacitance formed by the lateral section of the small N-well region 21 in addition to the capacitance obtained by the power source voltage VCC and the grounding voltage VSS (GND).

Figure 5A:
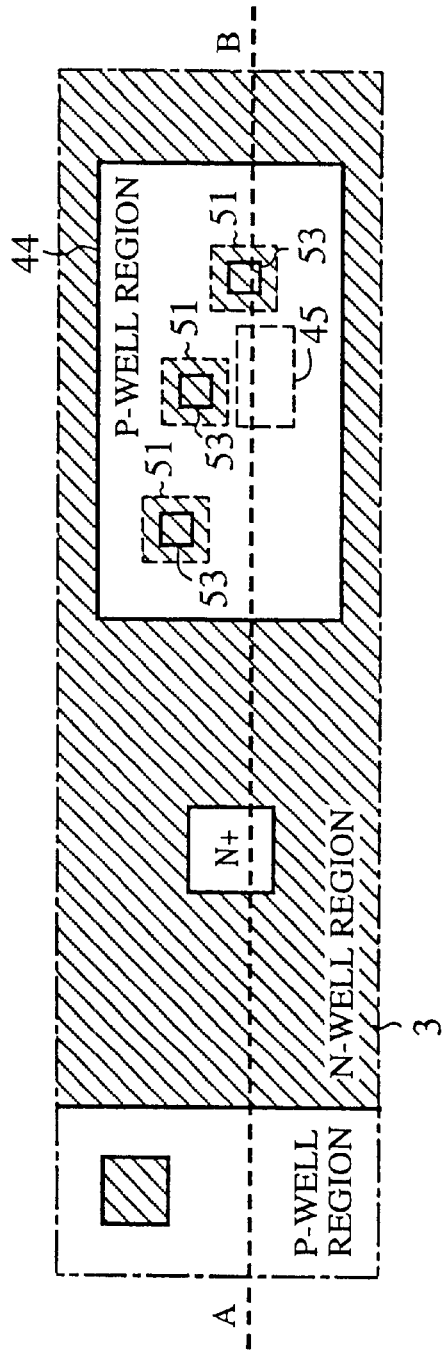
FIG. 5(a) is a plan view, (b) is a cross sectional view along the line A-B and (c) is an equivalent circuit.
Figure 5B:
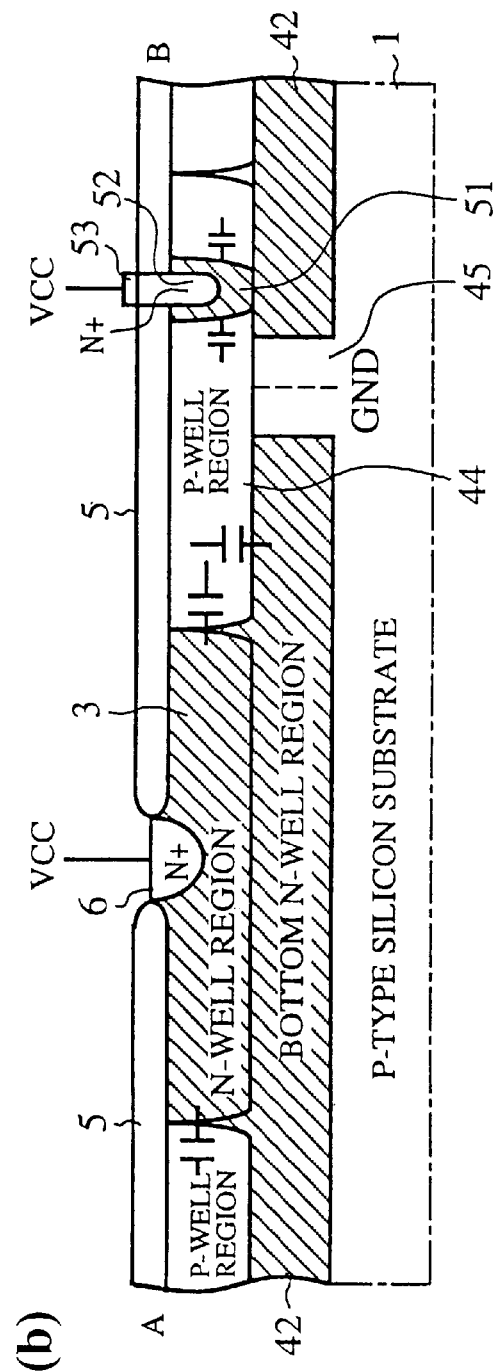
FIG. 5 shows another structure of a on-chip capacitor of a semiconductor integrated circuit according to a third embodiment of the present invention as shown in FIG. 4.
Figure 5C:

FIG. 5 shows another structure of an on-chip capacitor of a semiconductor integrated circuit according to a third embodiment of the present invention as shown in FIG. 4. FIG. 5(a) is a plan view, (b) is a cross sectional view along the line A-B and (c) is an equivalent circuit. In the figures, 51 is a small N-well region formed in the P-well region 44, 52 is a N+ dispersion region formed in the small N-well region 51, 53 is an electrode connected to the power source voltage VCC. Other components are the same or similar to those described in Embodiment 3 as shown in FIG. 4 above and are represented by the same reference numerals.

Figure 6A:
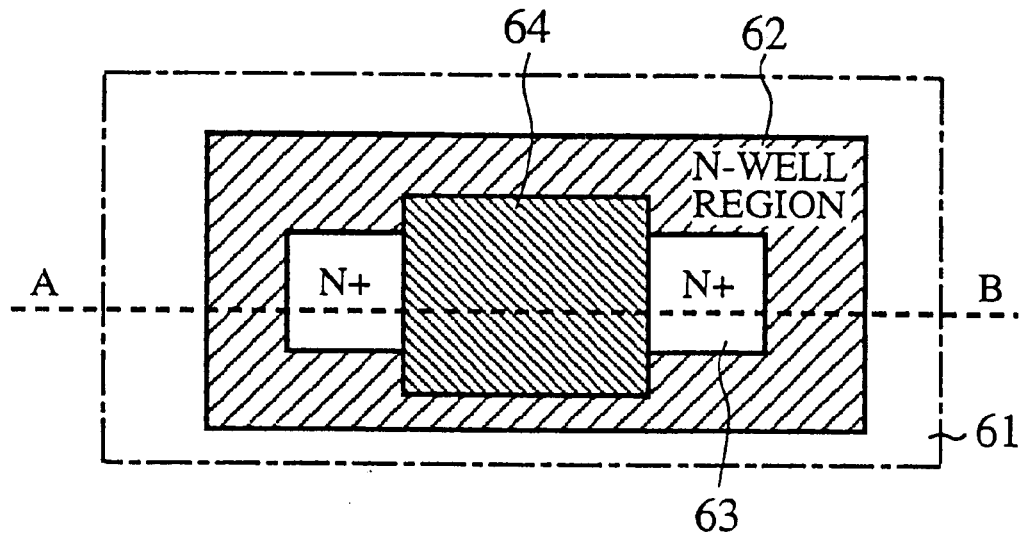
FIG. 6(a) is a plan view, (b) is a cross sectional view along the line A-B and (c) is an equivalent circuit.
Figure 6B:
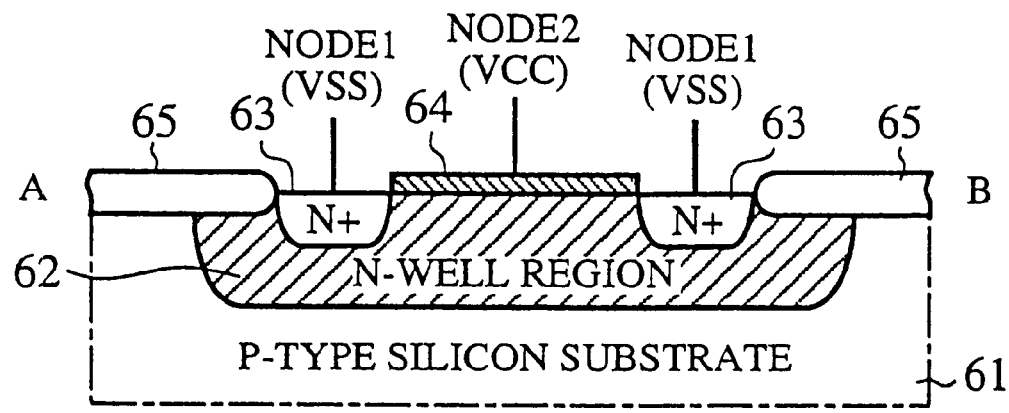
FIG. 6 shows another structure of a MOS capacitance of a semiconductor integrated circuit.
Figure 6C:
Figure 7A:
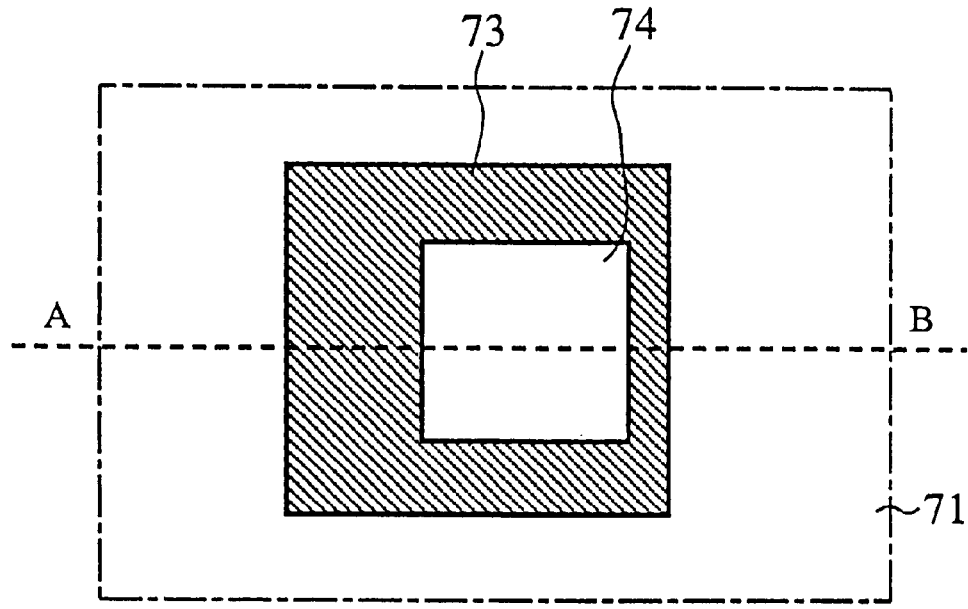
FIG. 7(a) is a plan view, (b) is a cross sectional view along the line A-B and (c) is an equivalent circuit.
Figure 7B:
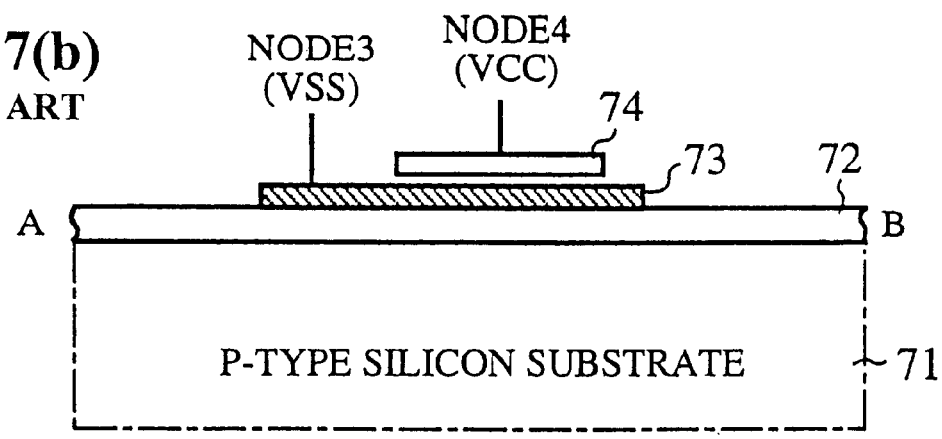
FIG. 7 shows the structure of a poly-silicon capacitance of a conventional semiconductor integrated circuit.
Figure 7C:
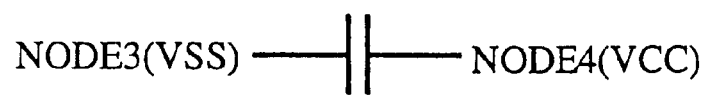

When the small N region 51 has the structure as shown in FIG. 5, it is required to provide an electrode 53 which is connected to the wiring of the power source voltage VCC. To that degree, the region which forms the device is reduced. However in comparison with the conventional example as shown in FIG. 6 to FIG. 8, it is possible to obtain a decoupling capacitance without the necessity to form a device.

As shown above, according to embodiment 3, an N-well region 3 and a P-well region 44 are formed on the bottom N-well region 42. A plurality of small N-well regions 51 are formed in the P-well region 44. Furthermore a coupling region 45 is formed which passes through the bottom N-well region 42 and which connects the P-well region 44 and the P-type silicon substrate 1. Thus it is possible to form a desired capacitance between the coupling surface with the N-well region and P-well region, between the P-well region and the plurality of small N-well regions, and furthermore between the bottom N-well region (or the bottom P-well region) and the P-well region (the N-well region) even when a space which provides an electrode applying the grounding power source VSS can not be maintained. It is thus possible to obtain a decoupling capacitance of a required capacitance without the necessity to maintain a device region, form a capacitance, maintain a designated wiring region or form wiring as in the case of a conventional MOS capacitance.

In embodiment 3 above, a bottom N-well region 42 is formed on a P-type silicon substrate 1, an N-well region 3 and a P-well region 44 are formed on the bottom N-well region 42 and a small N-well region 51 is formed in a P-well region 44. However by using the N-type silicon substrate as a silicon substrate, the same effect may be achieved even when a bottom P-well region is formed on the N-type silicon substrate or an N-well region or a P-well region is formed in the bottom P-well region or a P-well region is formed on the N-well region.

As shown above according to the present invention, since a P-well region and an N-well region are formed on a bottom N-well region (or a bottom P-well region) which is formed on a P-type silicon substrate (or an N-type silicon substrate), it is possible to form a coupling surface between the N-well region and the P-well region and to form a capacitance as large as desired between the bottom N-well region (or a bottom P-well region) and a P-well region (or an N-well region). It is not necessary to maintain a device region, to form a capacitance, to form wiring or maintain a wiring region as in a conventional MOS capacitance. Thus it is possible to obtain a required decoupling capacitance.

In accordance with the present invention, since a P-well region and an N-well region are formed on a bottom N-well region (or a bottom P-well region) which is formed on a P-type silicon substrate (or an N-type silicon substrate) and a plurality of small N-well regions (or small P-type regions) are formed in the P-well region (or the N-well region), it is possible to form a coupling surface between the N-well region and the P-well region and to form a capacitance as large as desired between the bottom N-well region (or a bottom P-well region) and a P-well region (or an N-well region) and between the plurality of small N-well regions (or small P-type regions) and the P-well region (or N-well region). Thus it is not necessary to maintain a device region, to form a capacitance, to form wiring or maintain a wiring region as in a conventional MOS capacitance and it is possible to obtain a required decoupling capacitance.

In accordance with the present invention, since a P-well region and an N-well region are formed on a bottom N-well region (or a bottom P-well region) and a plurality of small N-well regions (or small P-type regions) are formed in the P-well region (or the N-well region) and furthermore since a coupling region is formed between the P-type silicon substrate (or the N-type silicon substrate) and the N-well region (or the P-well region) through the bottom N-well region (or the bottom P-well region), it is possible to form a coupling surface between the N-well region and the P-well region and to form a capacitance as large as desired between the plurality of small N-well regions (or small P-type regions) and the P-well region (or N-well region). It is further possible to form a capacitance between the bottom N-well region (or the bottom P-well region) and the P-well region (or the N-well region) even when a space which provides an electrode applying an earthing electrical source VSS can not be maintained. Thus it is not necessary to maintain a device region, to form a capacitance, to form wiring or maintain a wiring region as in a conventional MOS capacitance and it is possible to obtain a required decoupling capacitance.

What is claimed is:

1. An on-chip capacitor is provided with a P-type silicon substrate, a bottom N-well region formed on said P-type silicon substrate, mutually adjacent first P-well and first N-well regions formed on said bottom N-well region, said first P-well region is formed in contact on both sides of the first N-well region, a first electrode formed on said first N-well region, and a second electrode formed on said first P-well region, a coupling surface is formed with said first N-well region and said first P-well region and a capacitance is formed between a first node and a second node formed between said first P-well region and said bottom N-well region, wherein a fixed number of second N-well regions without transistors or dispersion regions are formed in said first P-well region.

2. An on-chip capacitor comprising an N-type silicon substrate, a bottom P-well region formed on said N-type silicon substrate, mutually adjacent first N-well and first P-well regions formed on said bottom P-well region, said first N-well region is formed in contact on both sides of said first P-well region, a first electrode formed on said first P-well region, and a second electrode formed on said first N-well region, and a coupling surface is formed with said first N-well region and said first P-well region and a capacitance is formed between a first node and a second node formed between said first N-well region and said bottom P-well region, wherein a fixed number of second P-well regions without transistors or dispersion regions is provided in said first N-well region.

* * * * *